United States Patent
Nummer et al.

(10) Patent No.: US 8,363,488 B2
(45) Date of Patent: *Jan. 29, 2013

(54) REFERENCE VOLTAGE REGULATOR FOR EDRAM WITH VSS-SENSING

(75) Inventors: Muhammad Nummer, Ottawa (CA); Sergiy Romanovskyy, Ottawa (CA)

(73) Assignee: Taiwan Semiconductor Manufacturing Company, Ltd. (TW)

(*) Notice: Subject to any disclaimer, the term of this patent is extended or adjusted under 35 U.S.C. 154(b) by 0 days.

This patent is subject to a terminal disclaimer.

(21) Appl. No.: 13/252,598

(22) Filed: Oct. 4, 2011

(65) Prior Publication Data

US 2012/0020170 A1    Jan. 26, 2012

Related U.S. Application Data

(63) Continuation of application No. 12/796,926, filed on Jun. 9, 2010, now Pat. No. 8,059,475.

(60) Provisional application No. 61/218,644, filed on Jun. 19, 2009.

(51) Int. Cl.
*G11C 5/14* (2006.01)
(52) U.S. Cl. .................................. 365/189.09
(58) Field of Classification Search ............ 365/189.09
See application file for complete search history.

(56) References Cited

U.S. PATENT DOCUMENTS

| | | | |
|---|---|---|---|
| 6,351,426 B1 | 2/2002 | Ohsawa | |
| 6,954,371 B2 | 10/2005 | Hokari et al. | |
| 7,701,735 B2 | 4/2010 | Park et al. | |
| 8,089,475 B2 * | 1/2012 | Ito | 345/174 |
| 2006/0274564 A1 | 12/2006 | Kim | |

* cited by examiner

*Primary Examiner* — Amir Zarabian
*Assistant Examiner* — Anthan Tran
(74) *Attorney, Agent, or Firm* — Lowe Hauptman Ham & Berner, LLP

(57) ABSTRACT

In a method of operating a reference voltage regulator for an embedded dynamic random access memory (eDRAM) employing VSS-sensing with a reference level, an oscillator sends requests for sampling and correction to a control block between accesses of the eDRAM. The control block sends a pulse defining a time interval during which sampling and correction occurs to a pulse generator. A reference generator provides the reference level to a comparator. The comparator compares the reference level with a sampling of a reference voltage to decide if the reference voltage requires correction. The comparator sends a correction request to a pulse generator if the reference voltage requires correction. The pulse generator generates a correction pulse for a driver according to the correction request from the comparator. The driver adjusts the reference voltage during the correction pulse.

20 Claims, 3 Drawing Sheets

REFERENCE VOLTAGE REGULATOR FOR EDRAM WITH VSS-SENSING

CROSS-REFERENCE TO RELATED APPLICATIONS

The present application is a continuation application of U.S. patent application Ser. No. 12/796,926, filed on Jun. 9, 2010, which claims priority of U.S. Provisional Patent Application Ser. No. 61/218,644 filed on Jun. 19, 2009, the entire disclosures of which are incorporated herein by reference.

TECHNICAL FIELD

This invention relates generally to reference voltage regulator for embedded dynamic random access memory (eDRAM) and, in particular, to the generation of a precise reference voltage level for eDRAM employing VSS-sensing with reference level.

BACKGROUND

A reference voltage at half-VDD is not sufficient enough to provide fast sensing and does not allow operating with a shorter cycle time. Fast sensing can be performed only if there is a large drain source voltage (Vds) for transistors in sense amplifier. The solution is to use VSS- or VDD-sensing, dependent on the type of memory cell access transistor. For n-type access device VSS-sensing is used. To implement VSS-sensing, a stable reference level close to VSS is required. There are two conventional ways of generating the reference level: using an analog regulator or using reference cells. Each method has its own advantages and drawbacks.

Analog push-pull voltage regulator requires relatively small area for generator. However, large voltage regulation (dV/dI) requires a large reservoir capacitor to compensate for the ripple of the reference level. The ripple of reference level can be minimized by improving the response of the analog regulator, but it can be essentially done only by increasing standby current. Another problem for analog regulator is to generate stable levels close to VSS.

For conventional sensing schemes with reference cells, additional area in the array is needed and reference cells are usually different from regular memory cells and thus more complicated. To activate reference cells, special levels different from the power supply voltage (>VDD) and the ground voltage (<VSS) are required. Usually these levels are the same as the levels for regular word-lines. This increases load for internal generators that usually have low efficiency, and hence results in higher power consumption.

Accordingly, new schemes and methods are desired for the generation of a precise reference voltage level for eDRAM.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the invention.

A reference voltage (VREF) regulator scheme for the generation of a precise reference voltage level for eDRAM, employing VSS-sensing with reference level is provided. Using VSS-sensing allows operation at lower VDD values and increasing current through the sense amplifiers. A reference generator is a precise 'sample-and-correct' type of voltage generator. In the present disclosure, a "sample/correct" VREF generator is used to generate a reference level for eDRAM with VSS-sensing. Throughout the various views and illustrative embodiments of the present disclosure, like reference numbers are used to designate like elements.

Figure 1:
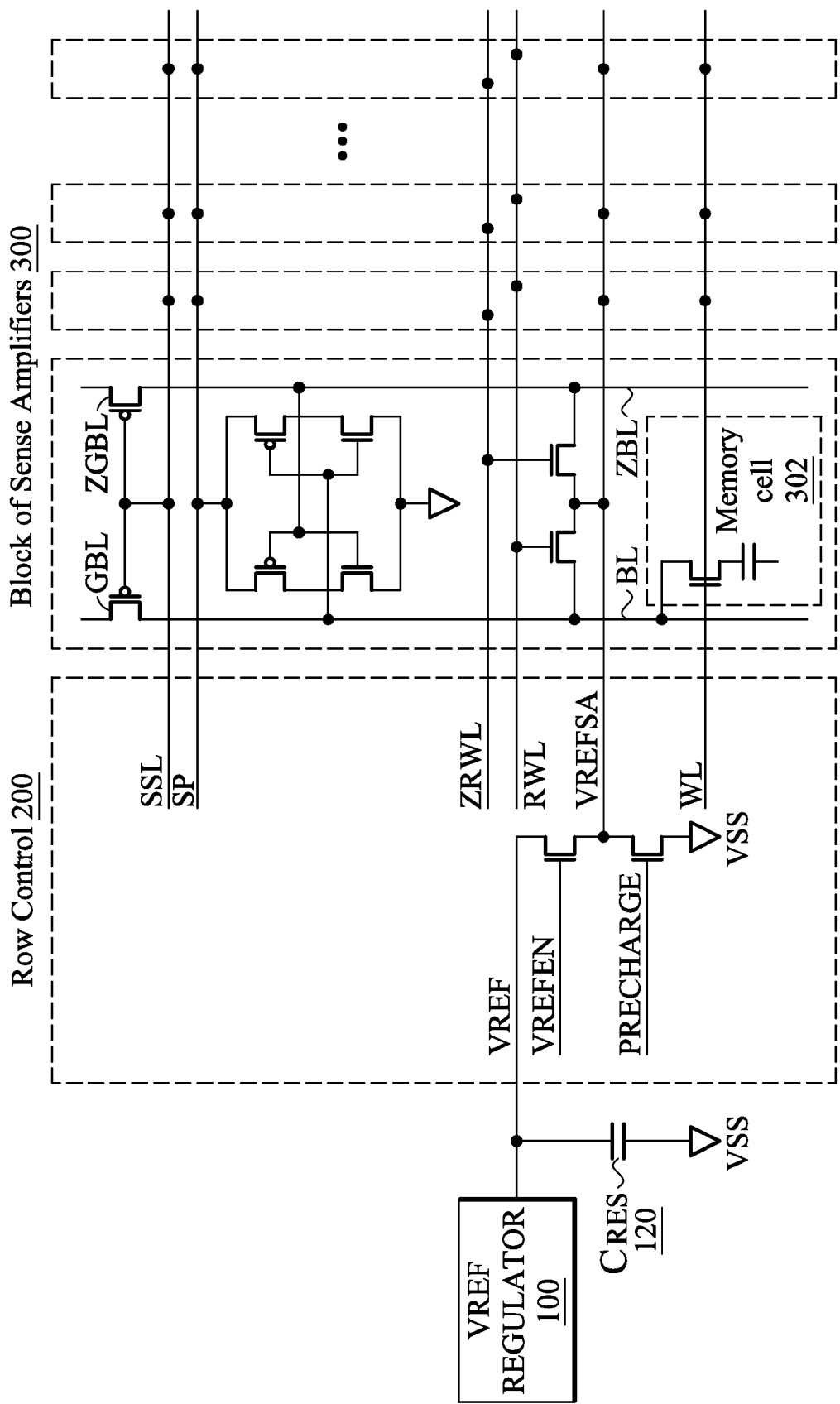
FIG. 1 illustrates an example of a simplified schematic of a sensing scheme in eDRAM according to one aspect of the disclosure.

FIG. 1 illustrates an example of a simplified schematic of a sensing scheme in eDRAM according one aspect of the disclosure. The VREF regulator 100 is connected to the row control circuit 200 through the reservoir capacitor 120 that further smoothes the output voltage from the VREF regulator. The row control circuit 200 is in turn connected to the block of sense amplifiers 300.

The main component of the sensing scheme is the sense amplifiers in the block 300. Bit-lines, i.e. BL and ZBL, are connected to multiple memory cells 302 and pre-charged to VSS. For every cycle, only one memory cell 302 is selected, and the charge stored in a memory cell capacitor is shared with the initial charge on the bit-line. If logic '0' is stored in the memory cell 302, the bit-line stays at the pre-charged level. In the case of logic '1', the bit-line moves above VSS, by about ~200 mV in one embodiment. A VREF regulator 100 generates reference level that is around 100 mV. This voltage is applied to another bit-line that works as a reference for the sense amplifier. Just prior to sensing, the selected bit-line is moved up by ~200 mV or stays at VSS, and another reference bit-line is moved up by ~100 mV.

Many sense amplifiers are grouped into one block 300 where all control lines are common. This block 300 is connected to a memory array segment with many bit-line pairs. During the sensing operation, all reference bit-lines in this segment, i.e. a half of all bit-lines, are moved to the reference level. All control lines (e.g. VREFSA, RWL, ZRWL, SP, SSL) inside one block of sense amplifiers 300 are common for all sense amplifiers. Global bit-lines, i.e. GBL and ZGBL, provide an interface between the sense amplifier and the periphery. Initially the global bit lines are also pre-charged to VSS, like local bit-lines BL and ZBL. The SSL signal is high during the bit-line sensing and keeps column access devices closed. The node VREFSA in the local sense amplifiers plays a dual role. When the word-lines are activated, node VREFSA is used to apply reference voltage to the reference bit-lines. In between word line activations, the VREFSA line stays at VSS, pre-charging all local bit-lines to ground.

Reference word-lines RWL and ZRWL are high during pre-charge and the VREFSA level is applied to both bit-lines. Before word-line activation, RWL or ZRWL (the line which does not correspond to the selected bit-line) is pushed down to VSS, and the connection between selected bit-line and VREFSA is off. After the word-line activation node VREFSA is connected to the reservoir capacitor 120, which is kept at VREF level, and all reference bit-lines in the memory array are pulled up from VSS to VREF level, selected bit-lines in memory array segment are driven by memory cells 302 and moved above VREF level or stay at VSS. When the difference between BL and ZBL is big enough, the other reference word-line is set low and at the same time SP node is pulled up amplifying an initial small differential signal. At the end of sensing, one bit line goes to VDD and the other stays at VSS.

Figure 2:
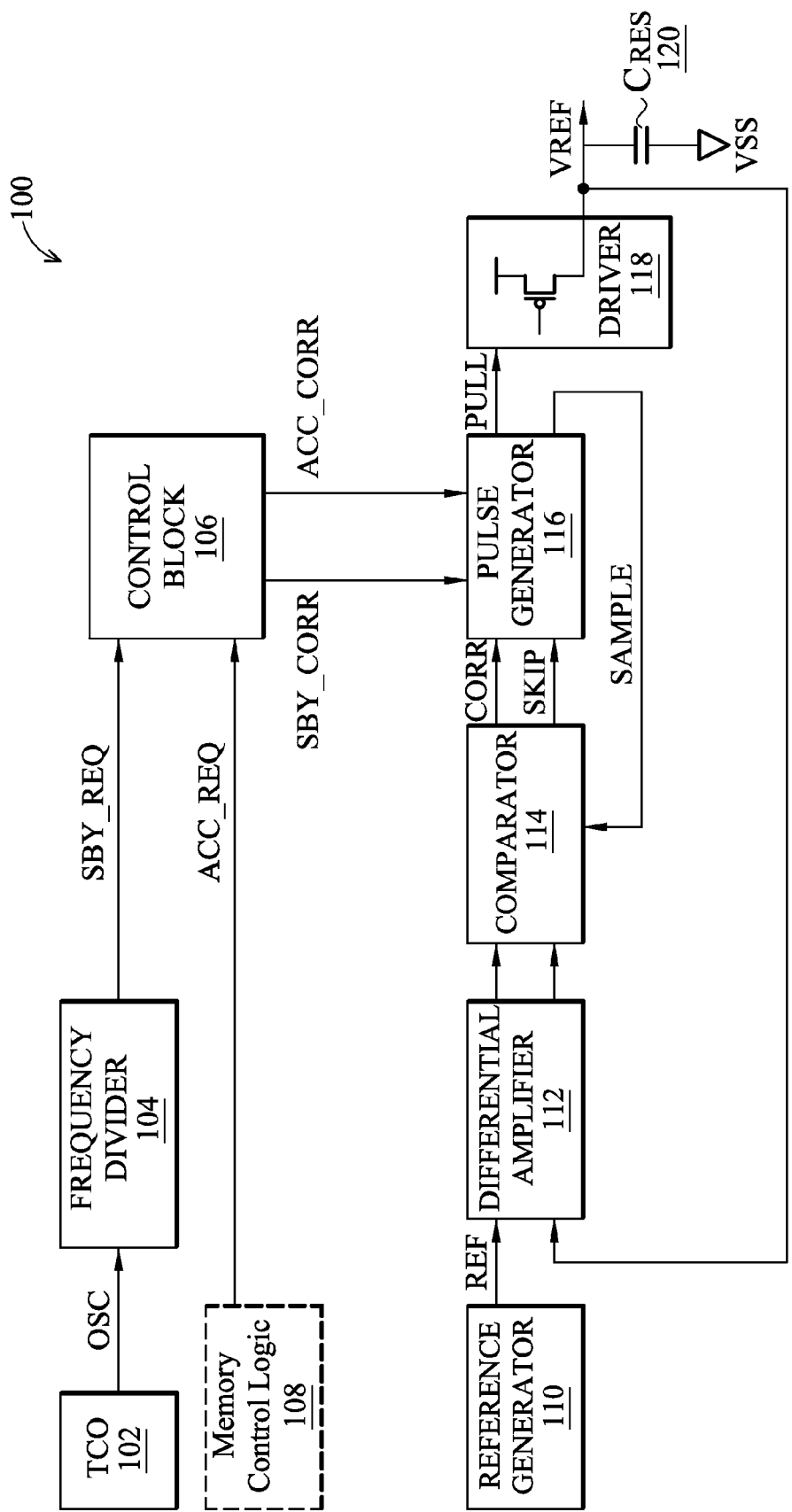
FIG. 2 illustrates an exemplary architecture of the reference voltage (VREF) regulator according to one aspect of this disclosure.

FIG. 2 illustrates an exemplary architecture of the reference voltage (VREF) regulator according to one aspect of this disclosure. The temperature-controlled oscillator (TCO) 102 is an oscillator with output frequency proportional to temperature. TCO 102 is used together with Frequency Divider 104 to generate requests for level sampling/correction between accesses. The control block 106 generates a pulse defining a time interval during which sampling/correction occurs. Requests can come from TCO 102 or from memory control logic 108 (in the dotted box to indicate outside of the VREF regulator 100).

The reference generator 110 provides a reference level for level comparison. The differential amplifier 112 amplifies the difference between the reference level and corrected output signal VREF. The Comparator 114 outputs a signal indicating if the level of output signal requires correction. Based on the Comparator output, the pulse generator 116 produces a short correction pulse for the driver 118, resets comparator 114 and launches a new comparison cycle. The driver 118 adjusts the output voltage during the pulse signal (PULL) duration from the pulse generator 116. The pulse width is wider if the correction is requested by the memory control logic 108 (ACC_REQ). In one embodiment, the reservoir capacitor 120 can be about ~1.5 nF capacitance, implemented with Metal Insulator Metal (MIM) decoupling capacitors.

During standby, TCO 102 sends requests to verify the VREF level, which degrades proportionally to the temperature because of leakage. Control block 106 generates a pulse that defines how long the "sampling/correction" cycle will last. Depending on how close VREF is to the internal reference level REF, there could be from 5 to 20 "sample/correct" attempts to minimize the difference between VREF and REF. Load current is much less during standby, which enables the regulator to operate in a more accurate mode and keep the VREF level with minimal ripples. Comparator 114 is included into the loop of pulse generator 116. Since internal delay in the comparator 114 is inversely proportional to the difference of its inputs, the "sample/correct" rate is higher when the difference is bigger and is lower when VREF is closer to REF. This approach reduces over-pumping and ripples.

During access, memory control logic 108 sends level verification requests every access cycle. Usually this "sample/correct" cycle is longer than the access cycle. Thus, if there is a continuous access, the VREF generator 100 is always active. Moreover, time intervals when the driver 118 is on are longer during an access than during a standby. This solution allows increasing load current during access. After an individual access or the last in a series of accesses, a standby correction request is generated from control block 106 to verify, and if required, correct the VREF level in a more accurate mode.

Figure 3:
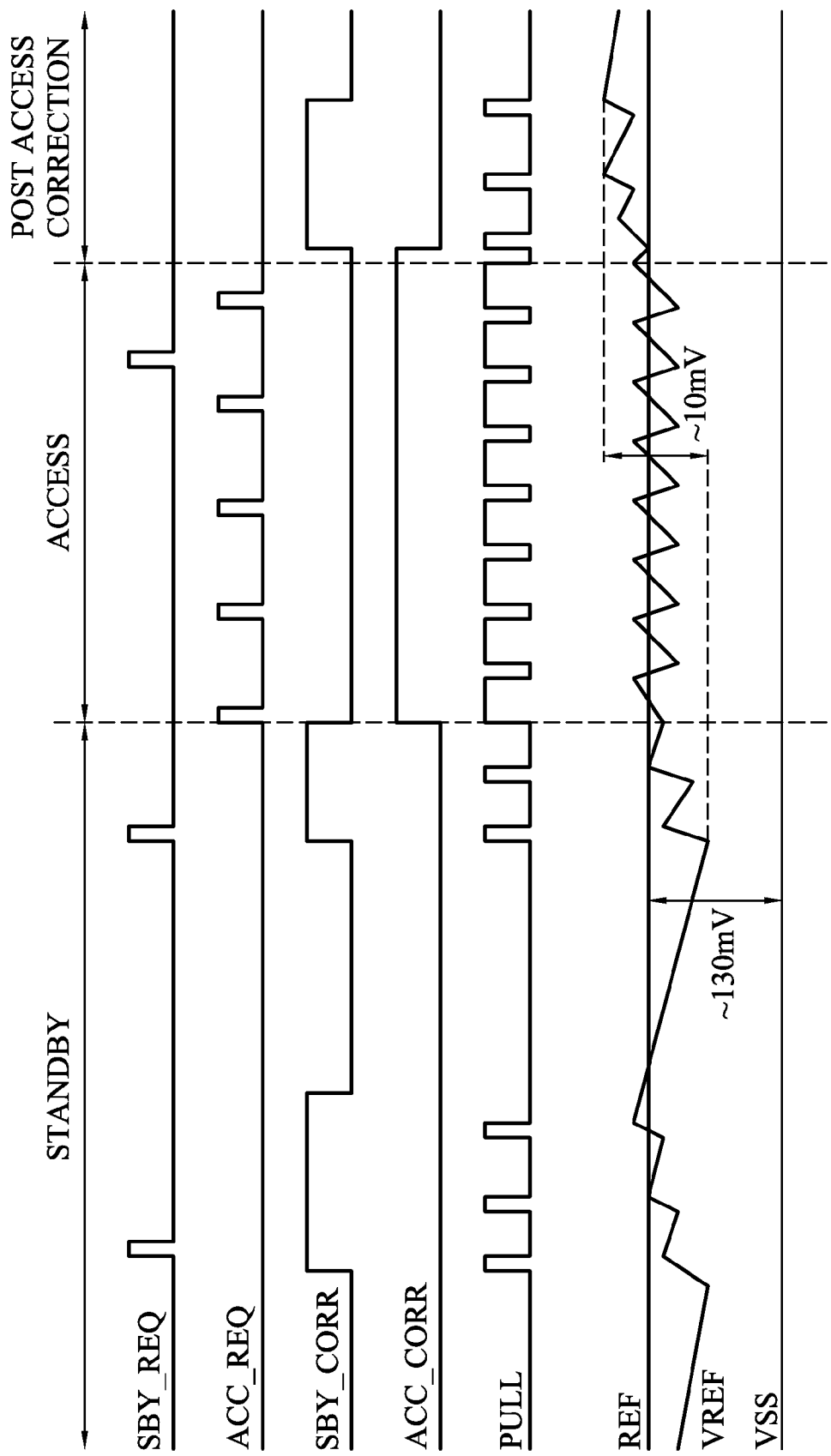
FIG. 3 illustrates exemplary waveforms of the VREF regulator shown in FIG. 2.

FIG. 3 illustrates exemplary waveforms of the VREF regulator shown in FIG. 2. During standby mode, the level verification requests (SBY_REQ) from TCO 102 through frequency divider 104 are shown as short pulses. These trigger the standby correction requests (SBY_CORR) from control block 106, which generates longer pulses defining time intervals during which sampling/correction occurs. The result is the multiple PULL signal (short pulses) generated from pulse generator 116, which corrects the VREF output using the driver 118. In this embodiment, the VREF reference voltage (REF) is shown to be ~130 mV above VSS.

During access, the level verification requests (ACC_REQ) for every access cycle sent from the memory control logic 108 to the control block 106 are shown as short pulses. These trigger the access correction requests (ACC_CORR) from control block 106, which generates longer pulses defining time intervals during which sampling/correction occurs, longer than the standby correction requests (SBY_CORR). Thus, because there is a continuous access during the access mode shown in FIG. 3, ACC_CORR is shown as a long continuous pulse during access instead of multiple pulses. The result is the multiple PULL signal (longer pulses compared to standby mode) generated from pulse generator 116, which corrects the VREF output using the driver 118. In this embodiment, the VREF output voltage is shown to be within ~10 mV of variation centered at the reference voltage (REF). After the accesses, the post-access correction is triggered by control block 106 that generates a standby correction request (SBY_CORR). This results in multiple PULL signal (short pulses) from pulse generator 116, which corrects the VREF output using the driver 118.

The reference level VREF has to have minimal process deviations and ripple during access in order to maximize the window for signal from the memory cell 302. To achieve this, various embodiments according to one aspect of this disclosure can have the following features: (1) power domain is the same as eDRAM domain, (2) high "sample/correct" rate (e.g. ~1 GHz), (3) when level needs to be corrected, correction is done by small steps (e.g. a few mV), yielding a more smooth reference level, (3) adaptive loop with the comparator 114 as part of sampling clock generation loop (the closer the reference level to the target, the lower the sampling rate; the next sampling is delayed until the required correction is fully finished, or is done immediately if correction is not required), (4) variable VREF step (small steps during standby operation and large steps during active operation to minimize overshoot during level correction), and (5) small arrays of Metal Insulator Metal (MIM) decoupling capacitors are combined into one reservoir capacitor that allows to use chip area more effectively because of high MIM-capacitance per area.

The advantageous features of this disclosure include lower power consumption than prior art approaches (e.g. push-pull amplifier) especially in standby mode (e.g. 32 μA instead of 200-300 μA for a typical 4 MBit in one embodiment), fast reaction time, smaller area (although area may be dominated by reservoir capacitor), better accuracy, and the ability to generate well controlled voltages close to ground (~100 mV typical), where the pull-down of a conventional amplifier would fall out of saturation. Using VSS-sensing to allow operation under lower VDD values and increasing current through sense amplifier. The 'sample-and-correct' scheme of the voltage regulator in eDRAM provides an adaptive correction method that has a higher sample/correct rate when the difference between a target reference voltage and the actual output voltage is bigger.

In particular, in one embodiment using a VSS-sensing scheme for eDRAM memory array with N-type memory array has a few advantages: (1) it allows operations with lower VDD without performance degradation, and all bit-lines are pre-charged to VSS and the current in sense amplifier during sensing is maximized, (2) differential signal is amplified with a P-type cross-coupled transistor pair, that has less offset than an N-type cross-coupled pair, (3) smaller offset makes possible to use a single direct reference level for many sense amplifiers grouped into a large array, and (4) bigger Vds in memory cell speeds up charge sharing during bit line split.

According to some embodiments, in a method of operating a reference voltage regulator for an embedded dynamic random access memory (eDRAM) employing VSS-sensing with a reference level, an oscillator sends requests for sampling and correction to a control block between accesses of the eDRAM. The control block sends a pulse defining a time interval during which sampling and correction occurs to a pulse generator. A reference generator provides the reference level to a comparator. The comparator compares the reference level with a sampling of a reference voltage to decide if the reference voltage requires correction. The comparator sends a correction request to a pulse generator if the reference voltage requires correction. The pulse generator generates a correction pulse for a driver according to the correction request from the comparator. The driver adjusts the reference voltage during the correction pulse.

In various embodiments, the reference voltage regulator adjusts a rate for sampling and correction so that the rate is higher when a difference between the reference level and the reference voltage is larger.

In various embodiments, the reference voltage regulator adjusts the rate by using an internal delay in the comparator that is inversely proportional to the difference between the reference level and the reference voltage.

In various embodiments, a memory control logic in the eDRAM sends requests for sampling and correction to the control block for an access.

In various embodiments, the pulse generator generates the correction pulse with a width that is wider when the memory control logic sends the requests for sampling and correction.

In various embodiments, the control block starts a new comparison cycle to correct the reference voltage after the access.

In various embodiments, a differential amplifier amplifies a difference between the reference level and the reference voltage and sends the amplified difference to the comparator.

In various embodiments, the pulse generator resets the comparator to launch a new comparison cycle when the pulse generator generates the correction pulse.

In various embodiments, a reservoir capacitor is coupled to the reference voltage output.

In various embodiments, the reservoir capacitor is implemented with Metal Insulator Metal (MIM) capacitors.

In various embodiments, the oscillator is a temperature controlled oscillator (TCO).

In various embodiments, the oscillator sends the requests for sampling and correction through a frequency divider to the control block.

According to some embodiments, in a method of regulating a reference voltage for an embedded dynamic random access memory (eDRAM) employing VSS-sensing with a reference level, an oscillator sends requests for sampling and correction through a frequency divider to a control block between accesses of the eDRAM. The control block sends a pulse defining a time interval during which sampling and correction occurs to a pulse generator. A reference generator provides the reference level to a comparator. The comparator compares the reference level with a sampling of the reference voltage to decide if the reference voltage requires correction. The comparator sends a correction request to the pulse generator if the reference voltage requires correction. A pulse generator generates a correction pulse for a driver according to the correction request from the comparator. The driver adjusts the reference voltage during the correction pulse. A differential amplifier amplifies a difference between the reference level and the reference voltage and sends the amplified difference to the comparator. A rate for sampling and correction is adjusted to be higher when the difference between the reference level and the reference voltage is larger.

According to some embodiments, in a method of regulating a reference voltage for an embedded dynamic random access memory (eDRAM) employing VSS-sensing with a reference level, a temperature controlled oscillator (TCO) sends requests for sampling and correction through a frequency divider to a control block between accesses of the eDRAM. The control block sends a pulse defining a time interval during which sampling and correction occurs to a pulse generator. A reference generator provides the reference level to a comparator. The comparator compares the reference level with a sampling of the reference voltage to decide if the reference voltage requires correction. The comparator sends a correction request to the pulse generator if the reference voltage requires correction. A pulse generator generates a correction pulse for a driver according to the correction request from the comparator. The driver adjusts the reference voltage during the correction pulse. A differential amplifier amplifies a difference between the reference level and the reference voltage and sends the amplified difference to the comparator. A rate for sampling and correction is adjusted to be higher when the difference between the reference level and the reference voltage is larger. When a memory control logic in the eDRAM sends requests for sampling and correction for an access, the control block starts a new comparison cycle to correct the reference voltage after the access.

A skilled person in the art will appreciate that there can be many embodiment variations of this disclosure. Although the advantages of the present disclosure have been described in detail, it should be understood that various changes, substitutions and alterations can be made herein without departing from the spirit and scope of the invention. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure.

What is claimed is:

1. A method of operating a reference voltage regulator for an embedded dynamic random access memory (eDRAM) employing VSS-sensing with a reference level, said reference voltage regulator including an oscillator, a control block, a reference generator, a comparator, a pulse generator, a driver and a reference voltage output, said method comprising:

the oscillator sending requests for sampling and correction to the control block between accesses of the eDRAM;

the control block sending a pulse defining a time interval during which sampling and correction occurs to the pulse generator;

the reference generator providing the reference level to the comparator;

the comparator comparing the reference level with a sampling of a reference voltage to decide if the reference voltage requires correction;

the comparator sending a correction request to the pulse generator if the reference voltage requires correction;

the pulse generator generating a correction pulse for the driver according to the correction request from the comparator; and the driver adjusting the reference voltage during the correction pulse.

2. The method of claim 1, further comprising
adjusting a rate for sampling and correction so that the rate is higher when a difference between the reference level and the reference voltage is larger.

3. The method of claim 2, wherein the adjusting comprises using an internal delay in the comparator that is inversely proportional to the difference between the reference level and the reference voltage.

4. The method of claim 1, further comprising
for an access, the control block receiving from a memory control logic in the eDRAM requests for sampling and correction.

5. The method of claim 4, wherein the pulse generator generates the correction pulse with a width that is wider upon receipt of the requests for sampling and correction from the memory control logic.

6. The method of claim 4, further comprising
the control block starting a new comparison cycle to correct the reference voltage after the access.

7. The method of claim 1, further comprising
amplifying, by a differential amplifier of the reference voltage regulator, a difference between the reference level and the reference voltage and sending the amplified difference to the comparator.

8. The method of claim 1, further comprising
the pulse generator resetting the comparator to launch a new comparison cycle when the pulse generator generates the correction pulse.

9. The method of claim 1, further comprising
smoothing the reference voltage by a reservoir capacitor coupled to an output of the driver.

10. The method of claim 9, wherein the reservoir capacitor is implemented with Metal Insulator Metal (MIM) capacitors.

11. The method of claim 1, wherein the oscillator is a temperature controlled oscillator (TCO).

12. The method of claim 1, wherein the oscillator sends the requests for sampling and correction through a frequency divider of the reference voltage regulator to the control block.

13. A method of regulating a reference voltage for an embedded dynamic random access memory (eDRAM) employing VSS-sensing with a reference level, said method comprising:
an oscillator sending requests for sampling and correction through a frequency divider to a control block between accesses of the eDRAM;
the control block sending a pulse defining a time interval during which sampling and correction occurs to a pulse generator;
a reference generator providing the reference level to a comparator;
the comparator comparing the reference level with a sampling of the reference voltage to decide if the reference voltage requires correction;
the comparator sending a correction request to the pulse generator if the reference voltage requires correction;
a pulse generator generating a correction pulse for a driver according to the correction request from the comparator;
the driver adjusting the reference voltage during the correction pulse; and
a differential amplifier amplifying a difference between the reference level and the reference voltage and sending the amplified difference to the comparator;
wherein a rate for sampling and correction is adjusted to be higher when the difference between the reference level and the reference voltage is larger.

14. The method of claim 13, wherein the rate is adjusted by using an internal delay in the comparator that is inversely proportional to the difference of the reference level and the reference voltage.

15. The method of claim 13, further comprising
a memory control logic in the eDRAM sending requests for sampling and correction to the control block for an access.

16. The method of claim 15, wherein the pulse generator generating the correction pulse with a width that is wider when the memory control logic sends the requests for sampling and correction.

17. The method of claim 15, further comprising
the control block starting a new comparison cycle to correct the reference voltage after the access.

18. The method of claim 13, further comprising
the pulse generator resetting the comparator to launch a new comparison cycle when the pulse generator produces the correction pulse.

19. A method of regulating a reference voltage for an embedded dynamic random access memory (eDRAM) employing VSS-sensing with a reference level, said method comprising:
a temperature controlled oscillator (TCO) sending requests for sampling and correction through a frequency divider to a control block between accesses of the eDRAM;
the control block sending a pulse defining a time interval during which sampling and correction occurs to a pulse generator;
a reference generator providing the reference level to a comparator;
the comparator comparing the reference level with a sampling of the reference voltage to decide if the reference voltage requires correction;
the comparator sending a correction request to the pulse generator if the reference voltage requires correction;
a pulse generator generating a correction pulse for a driver according to the correction request from the comparator;
the driver adjusting the reference voltage during the correction pulse; and
a differential amplifier amplifying a difference between the reference level and the reference voltage and sending the amplified difference to the comparator;
wherein
a rate for sampling and correction is adjusted to be higher when the difference between the reference level and the reference voltage is larger; and
when a memory control logic in the eDRAM sends requests for sampling and correction for an access, the control block starts a new comparison cycle to correct the reference voltage after the access.

20. The method of claim 19, further comprising:
the pulse generator generating correction pulses with a width that is wider when the memory control logic sends the requests for sampling and correction.

* * * * *